US011978503B2

(12) United States Patent
Chen et al.

(10) Patent No.: US 11,978,503 B2
(45) Date of Patent: May 7, 2024

(54) METHOD AND APPARATUS FOR DETERMINING SIGNAL MARGIN OF MEMORY CELL AND STORAGE MEDIUM

(71) Applicant: CHANGXIN MEMORY TECHNOLOGIES, INC., Hefei (CN)

(72) Inventors: Jian Chen, Hefei (CN); Chi-Shian Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 127 days.

(21) Appl. No.: 17/648,580

(22) Filed: Jan. 21, 2022

(65) Prior Publication Data

US 2022/0319577 A1 Oct. 6, 2022

Related U.S. Application Data

(63) Continuation of application No. PCT/CN2021/120399, filed on Sep. 24, 2021.

(30) Foreign Application Priority Data

Mar. 25, 2021 (CN) .......................... 202110321723.1

(51) Int. Cl.
*G11C 11/4091* (2006.01)
*G11C 11/4096* (2006.01)

(52) U.S. Cl.
CPC ...... *G11C 11/4091* (2013.01); *G11C 11/4096* (2013.01)

(58) Field of Classification Search
None
See application file for complete search history.

(56) References Cited

U.S. PATENT DOCUMENTS

| 5,265,056 | A | * | 11/1993 | Butler | ...................... G11C 8/08 |
| | | | | | 365/189.11 |
| 5,339,273 | A | | 8/1994 | Taguchi | |
| 5,610,867 | A | | 3/1997 | Debrosse et al. | |
| 5,973,952 | A | * | 10/1999 | Crafts | .................... H10B 12/00 |
| | | | | | 257/E23.114 |
| 6,453,433 | B1 | | 9/2002 | Vollrath | |
| 6,496,402 | B1 | | 12/2002 | Somasekhar et al. | |
| 6,958,947 | B2 | * | 10/2005 | Park | ....................... G11C 29/50 |
| | | | | | 365/201 |
| 7,099,182 | B2 | * | 8/2006 | Ohtake | .................. G11C 29/50 |
| | | | | | 257/E27.098 |

(Continued)

FOREIGN PATENT DOCUMENTS

| CN | 1572002 A | 1/2005 |
| CN | 101751985 A | 6/2010 |

(Continued)

*Primary Examiner* — Elias Mamo
(74) *Attorney, Agent, or Firm* — Cooper Legal Group, LLC

(57) ABSTRACT

The present disclosure relates to a method and apparatus for determining a signal margin (SM) of a memory cell, a storage medium and an electronic device, and relates to the technical field of integrated circuits. The method for determining an SM of a memory cell includes: when the memory cell performs write and read operations, determining a sense signal threshold of the memory cell under an influence of a noise; and determining, based on the sense signal threshold, an actual SM of the memory cell during data reading.

19 Claims, 10 Drawing Sheets

(56) References Cited

U.S. PATENT DOCUMENTS

| | | | |
|---|---|---|---|
| 7,688,656 B2 * | 3/2010 | Zhang | G11C 29/026 |
| | | | 365/207 |
| 8,605,526 B2 | 12/2013 | Huber et al. | |
| 8,705,268 B2 | 4/2014 | Buer et al. | |
| 9,093,175 B2 | 7/2015 | Barth, Jr. et al. | |
| 9,330,756 B2 * | 5/2016 | Bedeschi | G11C 13/0064 |
| 10,255,987 B1 | 4/2019 | Fifield | |
| 2009/0116325 A1 * | 5/2009 | Jenkins | G11C 29/50 |
| | | | 365/206 |
| 2010/0118631 A1 | 5/2010 | Kim et al. | |

FOREIGN PATENT DOCUMENTS

| | | |
|---|---|---|
| CN | 101836260 A | 9/2010 |
| CN | 102810335 A | 12/2012 |
| CN | 103187100 A | 7/2013 |
| CN | 109658970 A | 4/2019 |
| CN | 110223725 A | 9/2019 |
| CN | 112071356 A | 12/2020 |
| CN | 112885400 A | 6/2021 |
| CN | 112885401 A | 6/2021 |
| EP | 0947994 A2 | 3/1999 |
| EP | 0947994 A3 | 3/1999 |

* cited by examiner

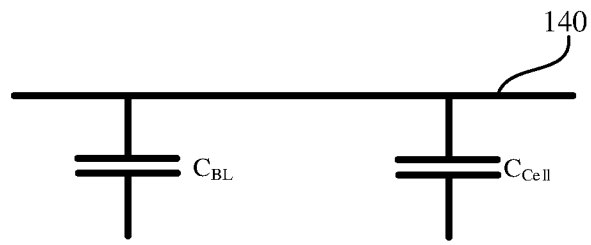
FIG. 3
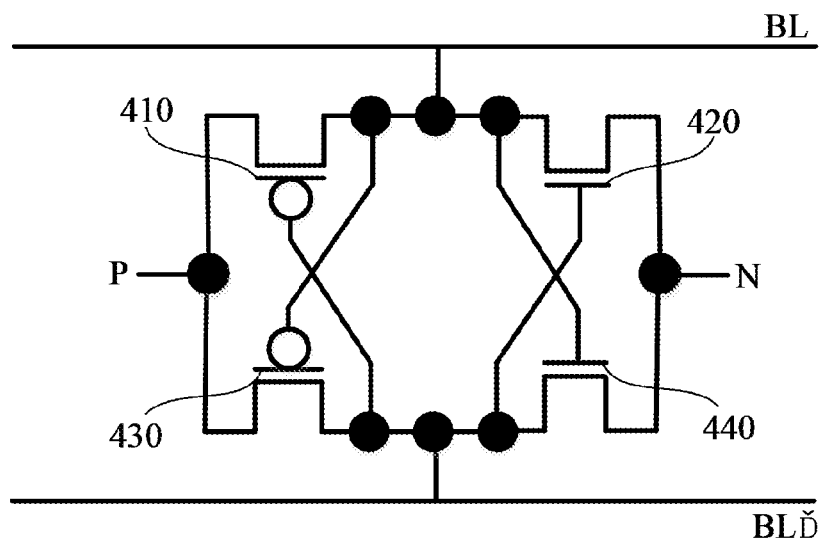
FIG. 4
S510
When a memory cell performs write and read operations, determine a sense signal threshold of the memory cell under the influence of a noise
S520
Determine, based on the sense signal threshold, an actual SM of the memory cell during data reading
FIG. 5

METHOD AND APPARATUS FOR DETERMINING SIGNAL MARGIN OF MEMORY CELL AND STORAGE MEDIUM

CROSS-REFERENCE TO RELATED APPLICATIONS

The present disclosure is a continuation application of International Patent Application No. PCT/CN2021/120399, titled "METHOD AND APPARATUS FOR DETERMINING SIGNAL MARGIN OF MEMORY CELL AND STORAGE MEDIUM" and filed on Sep. 24, 2021, which claims the priority to Chinese Patent Application No. 202110321723.1, titled "METHOD AND APPARATUS FOR DETERMINING SIGNAL MARGIN OF MEMORY CELL AND STORAGE MEDIUM" and filed on Mar. 25, 2021. The entire contents of International Patent Application No. PCT/CN2021/120399 and Chinese Patent Application No. 202110321723.1 are incorporated herein by reference.

TECHNICAL FIELD

The present disclosure relates to the technical field of integrated circuits, and specifically, to a method and apparatus for determining a signal margin (SM) of a memory cell, a storage medium and an electronic device.

BACKGROUND

As a commonly used semiconductor memory in computers, a dynamic random access memory (DRAM) is composed of many memory cells arranged in an array. Each memory cell usually includes a capacitor and a transistor.

In current DRAMs, a higher density of the memory cell array indicates a variety of noises in and among the memory cells. These noises usually consume the SM of the memory cell, reducing the actual available SM of the memory cell. If the actual available SM is too small, errors occur in DRAM data access.

Therefore, determining the actual SM of the memory cell in the DRAM is of great significance for evaluation of the DRAM performance.

It should be noted that information disclosed in the above background section is used merely for a better understanding of the background of the present disclosure, and therefore may include information that does not constitute the prior art known to those of ordinary skill in the art.

SUMMARY

An aspect of the present disclosure provides a method for determining a signal margin of a memory cell. The method includes: when the memory cell performs write and read operations, determining a sense signal threshold of the memory cell under an influence of a noise; and determining, based on the sense signal threshold, an actual signal margin of the memory cell during data reading.

An aspect of the present disclosure provides an apparatus for determining a signal margin of a memory cell. The apparatus includes:
 a processor; and
 a memory, configured to store an instruction executable by the processor, wherein
 the processor is configured to execute the executable instruction to perform the method for determining a signal margin of a memory cell, when executed by the processor, cause the processor to execute operations of: when the memory cell performs write and read operations, determining a sense signal threshold of the memory cell under influence of a noise; and determining, based on the sense signal threshold, an actual signal margin of the memory cell during data reading.

An aspect of the present disclosure provides a computer-readable storage medium. The computer-readable storage medium stores a computer program, and the computer program is executed by a processor to implement the foregoing method for determining a signal margin of a memory cell.

BRIEF DESCRIPTION OF THE DRAWINGS

The drawings incorporated into the specification and constituting part of the specification illustrate the embodiments of the present disclosure, and serve, together with the specification, to explain the principles of the present disclosure. Apparently, the drawings in the following description show merely some embodiments of the present disclosure, and those of ordinary skill in the art may still derive other drawings from these drawings without creative efforts. In the accompanying drawings:

FIG. 3 schematically illustrates a schematic structural diagram of a read operation of a memory cell in a DRAM according to an exemplary embodiment of the present disclosure;

FIG. 4 schematically illustrates a schematic structural diagram of a sense amplifier (SA) according to an exemplary embodiment of the present disclosure;

FIG. 5 schematically illustrates a flowchart of a method for determining an SM of a memory cell according to an exemplary embodiment of the present disclosure;

DETAILED DESCRIPTION

Figure 1:
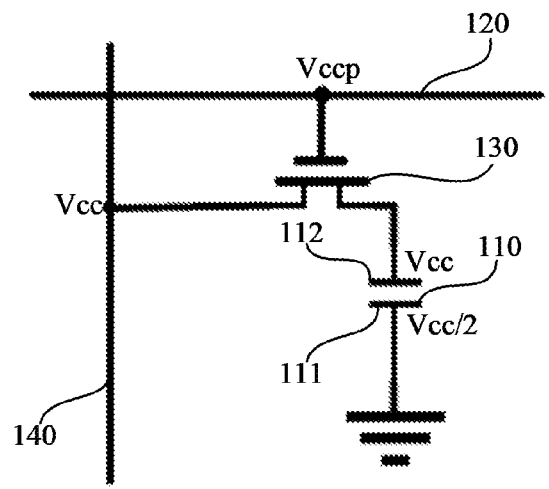
FIG. 1 schematically illustrates a schematic structural diagram 1 of a write operation of a memory cell in a DRAM according to an exemplary embodiment of the present disclosure.

Exemplary embodiments will be described below more comprehensively with reference to the accompanying drawings. However, the exemplary embodiments can be implemented in a plurality of forms and should not be construed as being limited to embodiments described herein. On the contrary, these embodiments are provided such that the present disclosure is more comprehensive and complete, and fully conveys the concept of the exemplary embodiments to those skilled in the art. The same reference numerals in the figures indicate the same or similar parts, and thus their detailed descriptions will be omitted.

Moreover, the described features, structures, or characteristics may be incorporated into one or more implementations in any suitable manner. In the following description, many specific details are provided to give a full understanding of the embodiments of the present disclosure. However, those skilled in the art will be aware that the technical solutions of the present disclosure may be practiced with one or more of the specific details omitted, or other methods, components, apparatuses, steps, and the like may be used. In other cases, well-known structures, methods, apparatuses, implementations, materials, or operations are not shown or described in detail to avoid obscuring aspects of the present invention.

Some of the block diagrams shown in the accompanying drawings are functional entities, and do not necessarily correspond to physically independent entities. That is, these functional entities may be implemented in the form of software, or implemented in one or more hardware modules, or implemented in different networks and/or processor apparatuses and/or microcontroller apparatuses.

In a DRAM integrated circuit device, memory cells in an array are typically arranged in rows and columns, such that a particular memory cell may be addressed by specifying a row and a column of its array. A word line connects the rows to a group of bit line SAs that detect data in the cells. A data subset in the SAs is then selected or "column-selected" for output in a read operation.

Each memory cell in the DRAM typically includes a capacitor and a transistor. In the transistor, the gate is connected to the word line, the drain is connected to the bit line, and the source is connected to the capacitor. A voltage signal on the word line controls the transistor to turn on or off, and then data information stored in the capacitor is read through the bit line, or data information is written into the capacitor through the bit line for storage.

Generally, when the memory cell in the DRAM performs the write operation, as shown in FIG. 1, a voltage of Vcc/2 is applied to a pole plate of a capacitor 110 in a memory cell 100 in the DRAM. When a write operation needs to be performed on the memory cell 100, a voltage Vccp (>Vcc) is applied to a word line 120 of the memory cell 100, and the voltage Vccp is applied to a gate of a transistor 130 of the memory cell 100. Usually, the voltage Vccp is greater than a turn-on voltage of the transistor 130. Therefore, after the voltage Vccp is applied, the transistor 130 is turned on, and then the write operation can be performed on the memory cell 100.

As shown in FIG. 1, when 1 is to be written, a voltage Vcc is applied to the bit line 140, and the voltage Vcc is conducted through the conductive transistor 130 from its drain to its source, and finally loaded onto the other pole plate of the capacitor 110.

Figure 2:
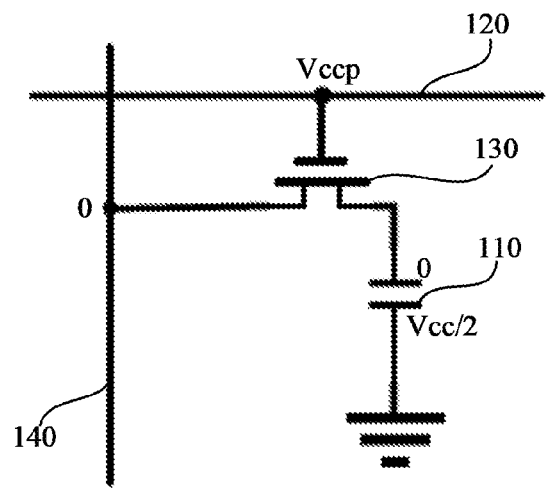
FIG. 2 schematically illustrates a schematic structural diagram 2 of a write operation of a memory cell in a DRAM according to an exemplary embodiment of the present disclosure.

As shown in FIG. 2, when 0 is to be written, a voltage of 0 V is applied to the bit line 140, such that a voltage on the other pole plate of the capacitor 110 is also 0 V.

In both FIG. 1 and FIG. 2, a voltage difference between the two pole plates of the capacitor 110 is equal in magnitude but opposite in direction. Therefore, whether data stored in the memory cell 100 is 1 or 0 may be determined based on the direction of the voltage difference between the two pole plates of the capacitor 110.

When the memory cell in the DRAM performs the read operation, a voltage greater than the turn-on voltage of the transistor 130 needs to be applied to the word line 120 of the memory cell 100 as well, to turn on the transistor 130. In this case, the charge on the capacitor 110 is released to the word line 120 through the transistor 130. In the actual case, referring to FIG. 3, the bit line 140 generates an equivalent capacitance CBL, and the voltage change amount on the bit line 140 during capacitor charge release is as shown in formula (1).

$$\Delta V = (V_{cc}/2) \frac{C_{Cell}}{C_{Cell} + C_{BL}} \quad (1)$$

Vcc is the operating voltage; $C_{Cell}$ is the capacitor capacitance. However, during the actual read operation, the voltage change amount $\Delta V$ is very small, and it is difficult for the DRAM to accurately determine whether the stored data is 0 or 1 during data reading. Therefore, it is necessary to add an SA to the DRAM to amplify the voltage change amount $\Delta V$.

FIG. 4 is a schematic structural diagram of the SA. A function of the SA is to amplify the "small" voltage change amount $\Delta V$ generated by the DRAM during the read operation into the operating voltage Vcc. The SA 400 in FIG. 4 includes a pair of bit lines BL and BL', and four transistors: a first transistor 410, a second transistor 420, a third transistor 430, and a fourth transistor 440. If data stored in the memory cell is 1, during a read operation, the voltage of the word line is first pulled up to Vccp, the transistors in the memory cell are turned on, and the memory cell is in a read/write active state. The pair of bit lines BL and BL' breaks the voltage. When 1 is read, a positive voltage is generated on the bit line BL, and this voltage causes the fourth transistor 440 to be turned on, such that a negative voltage on the node N is applied to the bit line BL and the gate of the first transistor 410 to turn them on. Finally, the voltage Vcc on the node P is applied to the bit line BL through the transistor of the DRAM, such that it is easy and accurate to determine whether the data stored in the memory cell is 1 or 0 depending on whether the voltage difference on the pair of bit lines is +Vcc or −Vcc.

Typically, a higher density of the array of memory cells in a DRAM integrated circuit device indicates more signal noises, for example, noises caused by data background coupling, leakage due to long storage time, short write time, insufficient precharge time, SA mismatch, and so on. These noises consume the theoretical voltage change amount ΔV, that is, the theoretical SM, reducing the actual SM for output. If the noise is too large, the actual SM is insufficient, and errors occur in DRAM data access.

Since the actual consumed margin is difficult to measure directly, an exemplary embodiment of the present disclosure provides a method for determining an SM of a memory cell. Referring to FIG. 5, the method for determining an SM of a memory cell may include the following steps.

Step S510: When the memory cell performs write and read operations, determine a sense signal threshold of the memory cell under the influence of a noise.

Step S520: Determine, based on the sense signal threshold, an actual SM of the memory cell during data reading.

According to the method for determining an SM of a memory cell in the exemplary embodiments of the present disclosure, a sense signal threshold of a memory cell under the influence of a noise is determined, and influences of a plurality of different noises to the memory cell during write and read operations are separately determined, to provide a basis for performance evaluation of a memory, thereby improving the accuracy of the performance evaluation. In addition, the sense signal threshold of the memory cell under the influence of the noise is calculated when the memory cell performs the write and read operations, to determine degrees to which the memory cell is affected by different noises, thus providing a basis for the performance improvement of the memory. The method has guiding significance for memory improvement.

It should be noted that the above-mentioned method for determining an SM of a memory cell is not only used in the DRAM, but may also be used in other memories having the memory cells, and this is not limited in the exemplary embodiments of the present disclosure.

The method for determining an SM of a memory cell in the exemplary embodiments of the present disclosure is further explained below by using memory cells in a DRAM as an example.

In step S510, when the memory cell performs write and read operations, a sense signal threshold of the memory cell under the influence of a noise is determined.

In an exemplary embodiment of the present disclosure, the noise includes at least one or more of an SA mismatch noise, a data background noise, a data retention time noise, and a signal timing noise.

In a practical situation, the second transistor 420 and the fourth transistor 440 in the SA 400 shown in FIG. 4 including N-Metal-Oxide-Semiconductor (NMOS) transistors are not perfectly isovoltage, that is, there is a voltage difference between the second transistor 420 and the fourth transistor 440. The voltage difference causes the SA mismatch and introduces a noise into the memory cell. Consequently, the SA consumes the theoretical SM during the read operation of the memory cell. If the consumed theoretical SM is too large, a bit failure is caused to the memory cell. If an FBC of the memory reaches a preset value, the memory is considered as failed.

Therefore, determining a first signal threshold of the memory cell under the influence of the SA mismatch noise is of great significance to feature evaluation of the memory. The first signal threshold refers to a voltage change amount ΔV on the bit line in the memory cell when the FBC of the memory reaches a preset allowable FBC after the SM is consumed by the SA noise and a remaining SM does not meet the demand.

In an exemplary embodiment of the present disclosure, the step of determining the first signal threshold of the memory cell under the influence of the SA mismatch noise includes: writing same data into a plurality of memory cells of a memory, setting a data retention time to a first preset time, setting a signal timing time to a second preset time, and determining the first signal threshold.

In practical applications, if different data is written into the plurality of memory cells in the memory, the memory cells storing different data will interfere with each other, thereby introducing the data background noise. In the exemplary embodiment of the present disclosure, the same data is written into the plurality of memory cells of the memory, to avoid the influence of the data background noise.

In practical applications, if data in the memory cell is retained for too long, transistor leakage occurs in the memory cell. Consequently, the charge stored on the capacitor is insufficient to correctly identify the data, resulting in data damage. In the exemplary embodiment of the present disclosure, the data retention time is set to the first preset time to reduce the data retention time and avoid transistor leakage, thereby avoiding the influence of the data retention time noise.

In an exemplary embodiment of the present disclosure, the first preset time is set to a minimum value, for example, 8 ms, such that the influence of the data retention time noise on the memory cell can be minimized.

In practical applications, a signal timing includes a plurality of operations performed by the memory cell. If the signal timing time is too short, a corresponding operation may not be completed, affecting the final accuracy of data reading. In the exemplary embodiment of the present disclosure, the signal timing time is set to the second preset time to extend a time of the operations in the signal timing, thereby ensuring the integrity of the operations in the signal timing and avoiding the influence of the signal timing noise.

In an exemplary embodiment of the present disclosure, the second preset time is set to a maximum value, for example, 50 ns, such that the influence of the signal timing noise on the memory cell can be minimized.

In summary, by avoiding the influence of the data background noise, minimizing the influence of the data retention time noise on the memory cell, and reducing the influence of the signal timing noise on the memory cell, the first signal threshold that is affected only by the SA mismatch noise is determined without the influences of the data background noise, the data retention time noise, and the signal timing noise.

Referring to FIG. 1, the pole plates of the capacitor 110 are named as a first pole plate 111 and a second pole plate 112, the first pole plate 111 is disposed opposite to the second pole plate 112, and the second pole plate 112 is connected to the source of the transistor 130 in the memory cell 100.

In an exemplary embodiment of the present disclosure, the process of determining the first signal threshold includes changing a voltage on the first pole plate 111 of the capacitor 110 in the memory cell 100 to obtain FBCs of the memory under influence of different voltages. The voltage on the first pole plate 111 is changed to change a voltage difference between the first pole plate 111 and the second pole plate 112, that is, change a voltage difference between the two pole plates of the capacitor. Changing the voltage difference between the two pole plates of the capacitor simulates a voltage difference between the transistors in the SA, thereby simulating the SA mismatch, thus providing a basis for determining the first signal threshold of the memory cell under the influence of the SA mismatch noise.

In an exemplary embodiment of the present disclosure, changing the voltage on the first pole plate 111 of the capacitor 110 in the memory cell 100 includes: changing the voltage on the first pole plate 111 of the capacitor 110 in the memory cell 100 from a first voltage $V_1$ to a second voltage $V_2$ before the memory cell 100 performs the write operation; and changing the voltage on the first pole plate 111 back to the first voltage $V_1$ before the memory cell 100 performs the read operation.

Usually, the voltage on the first pole plate 111 before the memory cell 100 performs the write operation is the first voltage $V_1$, and the first voltage $V_1$ is Vcc/2. If Vcc/2=0.5 V, the first voltage $V_1$=0.5 V.

In the exemplary embodiment of the present disclosure, the first voltage $V_1$ needs to be changed to the second voltage $V_2$ before the memory cell 100 performs the write operation. For example, the first voltage $V_1$ of 0.5 V is changed to the second voltage $V_2$ of 0.8 V. Before the memory cell 100 performs the read operation, the voltage on the first pole plate 111 needs to be changed back to the first voltage $V_1$, that is, the voltage on the first pole plate 111 needs to be changed from 0.8 V to 0.5 V. It is assumed that the voltage on the second pole plate 112 is Vcc=1 V during writing as shown in FIG. 1. Since the voltage on the first pole plate 111 is 0.8 V and the voltage on the second pole plate 112 is 1 V during writing, the voltage difference between the first pole plate 111 and the second pole plate 112 is −0.2 V. The voltage difference between the two pole plates of the capacitor does not change when the voltage on either of the pole plates is changed. Therefore, when the voltage on the first pole plate 111 is changed from 0.8 V to 0.5 V, the voltage on the second pole plate 112 is changed to 0.7 V, thus keeping the voltage difference between the first pole plate 111 and the second pole plate 112 still −0.2 V.

The voltage on the first pole plate 111 is changed, and the voltage difference between the first pole plate 111 and the second pole plate 112 is thus changed, thereby changing the signal to be amplified by the SA. This is equivalent to simulating the consumption of the signal by the SA.

Figure 6:
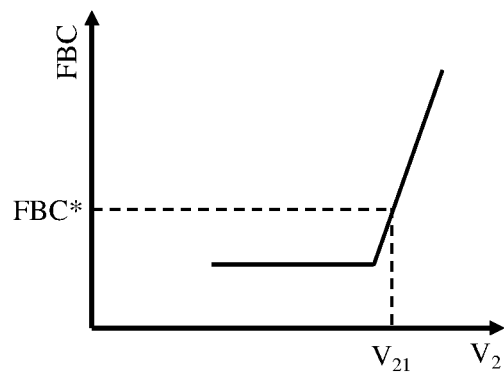
FIG. 6 schematically illustrates a curve of an FBC varying with a second voltage under the influence of an SA mismatch noise according to an exemplary embodiment of the present disclosure.

In practical applications, the second voltage $V_2$ may be set according to the actual situation, and the FBCs corresponding to different second voltages $V_2$ may be obtained by changing the second voltage $V_2$. FIG. 6 shows a curve of the FBC varying with the second voltage $V_2$.

Based on the curve of the FBC varying with the second voltage $V_2$ shown in FIG. 6, a critical voltage difference at which SA mismatch occurs can be determined. At the critical voltage difference, the remaining SM is offset by the SA mismatch, making the SA unable to recognize the signal and thus causing the memory cell to fail, that is, the bit failure.

If the FBC of the memory reaches the preset allowable FBC*, the voltage change amount ΔV on the bit line during the read operation of the memory cell may be determined as the first signal threshold $V_{L1}$ based on the second voltage $V_{21}$ corresponding to the preset allowable FBC*. When the second voltage $V_2$ is greater than $V_{21}$, there may be a large number of failed bits, resulting in errors in data reading of the memory.

In practical applications, the FBC of the memory may be determined by counting the quantity of memory cells in which the data written and the data read differ. The FBC may alternatively be determined in other manners. This is not specially limited in the exemplary embodiment of the present disclosure.

In practical applications, the preset allowable FBC may be set according to the actual situation, for example, set to any number between 1/1000 to 1/10,000. This is not specially limited in the exemplary embodiment of the present disclosure. Similarly, the second voltage $V_2$ may be determined according to the actual situation, for example, the second voltage $V_2$ may be any number between 0 mV and 1000 mV. In the process of changing the second voltage, the second voltage may be changed at a fixed step, for example, a step of 10 mV. The second voltage may alternatively be changed in other ways. This is not specially limited in the exemplary embodiment of the present disclosure. In the exemplary embodiment of the present disclosure, the first signal threshold $V_{L1}$ may be calculated according to formula (2) as follows.

$$V_{L1} = \frac{C_{Cell}}{C_{Cell} + C_{BL}} \times |V_A - V_B - (V_{21} - V_1)| \quad (2)$$

$V_B$ is the voltage of the bit line before the word line is turned on, and $V_A$ is the voltage of the bit line amplified by the SA after the word line is turned on.

Figure 7:
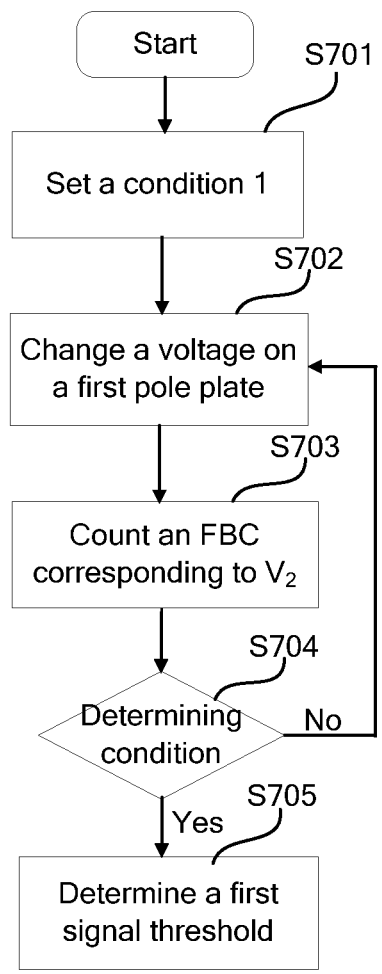
FIG. 7 schematically illustrates a flowchart for determining a first signal threshold under the influence of an SA mismatch noise according to an exemplary embodiment of the present disclosure.

FIG. 7 is a flowchart for determining the first signal threshold provided in an exemplary embodiment of the present disclosure. As shown in FIG. 7, in step S701, a condition 1 is first set, where the condition 1 includes: writing same data into a plurality of memory cells of the memory, setting the data retention time to a first preset time, and setting the signal timing time to a second preset time. In step S702, a voltage on the first pole plate of the capacitor in the memory cell is changed, specifically including: changing the voltage on the first pole plate of the capacitor in the memory cell from the first voltage to the second voltage $V_2$ before the memory cell performs the write operation; and changing the voltage on the first pole plate back to the first voltage before the memory cell performs the read operation. In step S703, the FBC of the memory corresponding to the second voltage $V_2$ is calculated, that is, the FBC corresponding to $V_2$ is calculated. In step S704, a determining condition is entered, to be specific, determining whether the FBC reaches a preset allowable FBC*; and if not, proceeding to step S702; or if yes, proceeding to step S705, to determine the first signal threshold, which specifically includes: determining the voltage change amount ΔV that is on the bit line during the read operation of the memory cell corresponding to the second voltage $V_2$ as the first signal threshold.

As previously mentioned, in practical applications, if different data is written into the plurality of memory cells in the memory, the memory cells storing different data will interfere with each other, thereby introducing the data background noise. Therefore, determining a second signal threshold of the memory cell under the influence of the data background noise is also of great significance to feature evaluation of the memory. The second signal threshold refers to a voltage change amount on the bit line in the memory cell when the FBC of the memory reaches a preset allowable FBC after the SM is consumed by the data background noise and a remaining SM does not meet the demand.

In an exemplary embodiment of the present disclosure, determining the second signal threshold of the memory cell under the influence of the data background noise includes: writing different data into a plurality of memory cells of the memory, setting a data retention time to a first preset time, and setting a signal timing time to a second preset time, and determining the second signal threshold.

As previously mentioned, setting the data retention time to the first preset time can avoid the influence of the data retention time noise; setting the signal timing time to the second preset time can reduce the influence of the signal timing noise on the memory cell, such that the second signal threshold can be determined without the influences of the data retention time noise and the signal timing noise.

In practical applications, data may be written into the plurality of memory cells of the memory with reference to the data distribution structure BG0 shown in Table 1.

TABLE 1

| 0 | 1 | 0 | 1 |
|---|---|---|---|
| 1 | 0 | 1 | 0 |
| 0 | 1 | 0 | 1 |
| 1 | 0 | 1 | 0 |

In the exemplary embodiment of the present disclosure, the process of determining the second signal threshold includes: changing a voltage on the first pole plate 111 of the capacitor 110 in the memory cell 100 to obtain FBCs of the memory under influence of different voltages. The voltage on the first pole plate 111 is changed to change a voltage difference between the first pole plate 111 and the second pole plate 112, that is, change a voltage difference between the two pole plates of the capacitor. Changing the voltage difference between the two pole plates of the capacitor simulates the influence of the data background noise on the memory cell. It should be noted that the influence of the SA mismatch noise also exists in the process of determining the influence of the data background noise. That is, the second signal threshold includes the influences of both the data background noise and the SA mismatch noise.

In the exemplary embodiment of the present disclosure, the specific method for changing the voltage on the first pole plate 111 of the capacitor 110 in the memory cell 100 and obtaining the corresponding FBCs is performed with reference to the process of obtaining the first signal threshold and is not described in detail herein.

Figure 8:
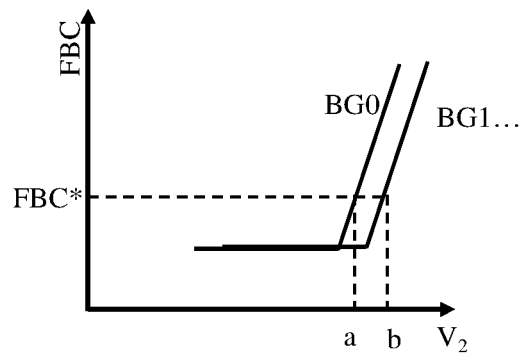
FIG. 8 schematically illustrates a curve of an FBC varying with a second voltage under the influence of a data background noise according to an exemplary embodiment of the present disclosure.

In the state of the data distribution structure BG0, an obtained curve of the FBC varying with the second voltage $V_2$ is shown in FIG. 8. In this case, the second voltage $V_2$ on the first pole plate 111 when the FBC reaches the preset allowable FBC* is a.

Then, the data distribution structure is changed, for example, to BG1 as shown in Table 2, or BG2 as shown in Table 3.

TABLE 2

| 1 | 0 | 1 | 0 |
|---|---|---|---|
| 1 | 0 | 1 | 0 |
| 1 | 0 | 1 | 0 |
| 1 | 0 | 1 | 0 |

TABLE 3

| 1 | 0 | 0 | 0 |
|---|---|---|---|
| 1 | 0 | 0 | 0 |
| 1 | 0 | 0 | 0 |
| 1 | 0 | 0 | 0 |

In practical applications, the specific data distribution structure is not limited to the above BG0 to BG2, and may have many variations, which are not listed in the exemplary embodiment of the present disclosure.

Similarly, in the state of the data distribution structure BG1, an obtained curve of the FBC varying with the second voltage $V_2$ is shown in FIG. 8. In this case, the second voltage $V_2$ on the first pole plate 111 when the FBC reaches the preset allowable FBC* is b. By analogy, different second voltages $V_2$ on the first pole plate corresponding to different data distribution structures when the FBC reaches the preset allowable FBC are obtained.

The minimum value among the plurality of different second voltages $V_2$ is determined as the minimum voltage $V_{22}$. At the minimum voltage $V_{22}$, bit failures may occur to the memory cells under the influence of the data background noise. When the second voltage $V_2$ is greater than $V_{22}$, a large number of bit failures occur, resulting in errors in data reading of the memory. Therefore, the voltage change amount $\Delta V$ that is on the bit line during the read operation of the memory cell and that corresponds to the minimum voltage $V_{22}$ is determined as the second signal threshold $VL_2$.

In an exemplary embodiment of the present disclosure, the second signal threshold $VL_2$ may be calculated according to formula (3) as follows.

$$V_{L2} = \frac{C_{Cell}}{C_{Cell} + C_{BL}} \times |V_A - V_B - (V_{22} - V_1)| \quad (3)$$

Figure 9:
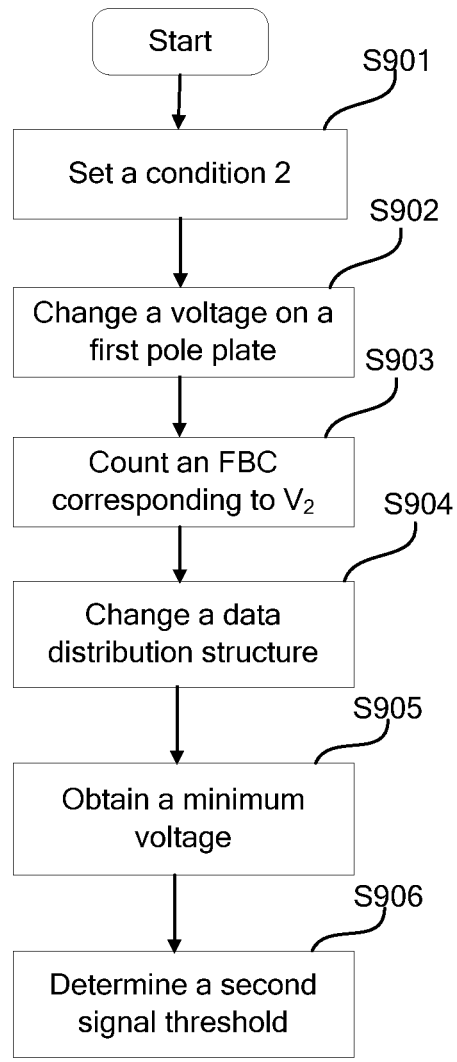
FIG. 9 schematically illustrates a flowchart for determining a second signal threshold under the influence of a data background noise according to an exemplary embodiment of the present disclosure.

FIG. 9 is a flowchart for determining the second signal threshold provided in an exemplary embodiment of the present disclosure. As shown in FIG. 9, in step S901, a condition 2 is first set, where the condition 2 includes: writing different data into a plurality of memory cells of the memory based on different data distribution structures, setting the data retention time to a first preset time, and setting the signal timing time to a second preset time. In step S902, a voltage on the first pole plate of the capacitor in the memory cell is changed, specifically including: changing the voltage on the first pole plate of the capacitor in the memory cell from the first voltage to the second voltage $V_2$ before the memory cell performs the write operation; and changing the voltage on the first pole plate back to the first voltage before the memory cell performs the read operation. In step S903, the FBC of the memory corresponding to the second voltage $V_2$ is calculated, that is, the FBC corresponding to $V_2$ is calculated. In step S904, the data distribution structure is changed. In step S905, a minimum voltage of different voltages on the first pole plate corresponding to different data distribution structures when the FBC reaches a preset allowable FBC is determined. In step S906, the second signal threshold is determined, which specifically includes: determining the voltage change amount that is on the bit line during the read operation of the memory cell corresponding to the minimum voltage as the second signal threshold.

As previously mentioned, in practical applications, if data in the memory cell is retained for too long, transistor leakage occurs in the memory cell. Consequently, the charge stored on the capacitor is insufficient to correctly identify the data, resulting in data damage. Therefore, determining a third signal threshold of the memory cell under the influence of the data retention time noise is also of great significance to feature evaluation of the memory. The third signal threshold refers to a voltage change amount on the bit line in the memory cell when the FBC of the memory reaches a preset allowable FBC after the SM is consumed by the data retention time noise and a remaining SM does not meet the demand.

In an exemplary embodiment of the present disclosure, determining the third signal threshold of the memory cell under the influence of the data retention time noise includes: writing same data into a plurality of memory cells of the memory to remove the influence of the data background noise; setting the signal timing time to a second preset time to reduce the influence of the signal timing noise on the memory cell; setting the data retention time to a predetermined retention time, such that the third signal threshold is determined without the influences of the data background noise and the signal timing noise.

In practical applications, the data retention time may be set with reference to the JEDEC standard. The predetermined retention time may range from 8 ms to 256 ms. For example, a first predetermined retention time may be 10 ms and a second predetermined retention time may be 20 ms. The predetermined retention time is determined at steps of 10 ms. The predetermined retention time may alternatively be determined in other ways. This is not specially limited in the exemplary embodiment of the present disclosure.

In an exemplary embodiment of the present disclosure, the process of determining the third signal threshold includes: changing the voltage on the first pole plate 111 of the capacitor 110 in the memory cell 100 to obtain FBCs of the memory under influence of different voltages. The voltage on the first pole plate 111 is changed to change a voltage difference between the first pole plate 111 and the second pole plate 112, that is, change a voltage difference between the two pole plates of the capacitor. Changing the voltage difference between the two pole plates of the capacitor simulates the influence of the data retention time noise on the memory cell. It should be noted that the influence of the SA mismatch noise also exists in the process of determining the influence of the data retention time noise; that is, the third signal threshold includes the influences of both the data retention time noise and the SA mismatch noise.

In the exemplary embodiment of the present disclosure, the specific method for changing the voltage on the first pole plate 111 of the capacitor 110 in the memory cell 100 and obtaining the corresponding FBCs is performed with reference to the process of obtaining the first signal threshold and is not described in detail herein.

Figure 10:
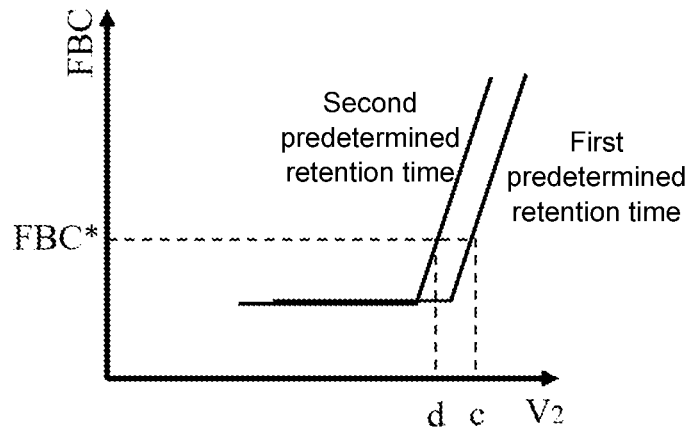
FIG. 10 schematically illustrates a curve of an FBC varying with a second voltage under the influence of a data retention time noise according to an exemplary embodiment of the present disclosure.

The predetermined retention time is changed, and different voltages on the first pole plate corresponding to different predetermined retention times when the FBC reaches the preset allowable FBC are obtained. For example, an obtained curve of the FBC varying with the second voltage $V_2$ corresponding to the first predetermined retention time may be as shown in FIG. 10. In this case, the second voltage $V_2$ on the first pole plate 111 when the FBC reaches the preset allowable FBC* is c.

Similarly, an obtained curve of the FBC varying with the second voltage $V_2$ corresponding to the second predetermined retention time may be as shown in FIG. 10. In this case, the second voltage $V_2$ on the first pole plate 111 when the FBC reaches the preset allowable FBC* is d. By analogy, different second voltages $V_2$ on the first pole plate corresponding to different predetermined retention times when the FBC reaches the preset allowable FBC are obtained.

The minimum value of a plurality of different voltages, that is, the plurality of different second voltages $V_2$, is determined as a minimum voltage $V_{23}$. At the minimum voltage $V_{23}$, bit failures may occur to the memory cells under the influence of the data retention time noise. When the second voltage $V_2$ is greater than $V_{23}$, a large number of bit failures occur, resulting in errors in data reading of the memory. Therefore, the voltage change amount $\Delta V$ that is on the bit line during the read operation of the memory cell and that corresponds to the minimum voltage $V_{23}$ is determined as the third signal threshold $VL_3$. In an exemplary embodiment of the present disclosure, the third signal threshold $VL_3$ may be calculated according to formula (4) as follows.

$$V_{L3} = \frac{C_{Cell}}{C_{Cell} + C_{BL}} \times |V_A - V_B - (V_{23} - V_1)| \quad (4)$$

Figure 11:
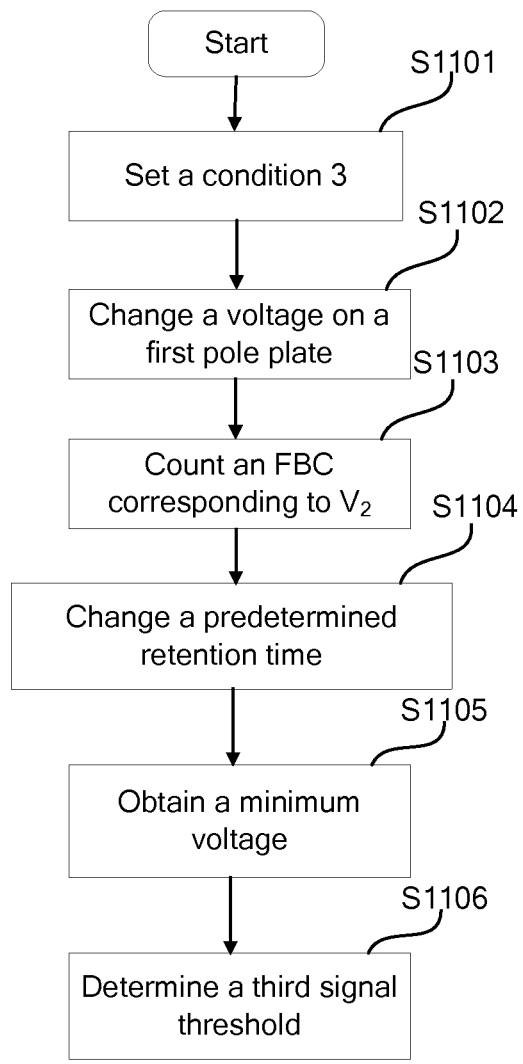
FIG. 11 schematically illustrates a flowchart for determining a third signal threshold under the influence of a data retention time noise according to an exemplary embodiment of the present disclosure.

FIG. 11 is a flowchart for determining the third signal threshold provided in an exemplary embodiment of the present disclosure. As shown in FIG. 11, in step S1101, a condition 3 is first set, where the condition 3 includes: writing same data into a plurality of memory cells of the memory, setting the signal timing time to a second preset time, and setting the data retention time to a predetermined retention time. In step S1102, a voltage on the first pole plate of the capacitor in the memory cell is changed, specifically including: changing the voltage on the first pole plate of the capacitor in the memory cell from the first voltage to the second voltage $V_2$ before the memory cell performs the write operation; and changing the voltage on the first pole plate back to the first voltage before the memory cell performs the read operation. In step S1103, the FBC of the memory corresponding to the second voltage $V_2$ is calculated, that is, the FBC corresponding to $V_2$ is calculated. In step S1104, the predetermined retention time is changed. In step S1105, a minimum voltage of different voltages on the first pole plate corresponding to different predetermined retention times when the FBC reaches a preset allowable FBC is determined. In step S1106, the third signal threshold is determined, which specifically includes: determining, as the third signal threshold, the voltage change amount that is on the bit line during the read operation of the memory cell and that corresponds to the minimum voltage.

As described above, in practical applications, if the signal timing time is too short, a corresponding operation may not be completed, affecting the final accuracy of data reading. Therefore, determining a fourth signal threshold of the memory cell under the influence of the signal timing noise is also of great significance to feature evaluation of the memory. The fourth signal threshold refers to a voltage change amount $\Delta V$ on the bit line in the memory cell when the FBC of the memory reaches a preset allowable FBC after the SM is consumed by the signal timing noise and a remaining SM does not meet the demand.

In an exemplary embodiment of the present disclosure, determining the fourth signal threshold of the memory cell under the influence of the signal timing noise includes: writing same data into the memory cells of the memory to remove the influence of the data background noise; setting the data retention time to a first preset time to reduce the influence of the data retention time noise; setting the signal timing time to a predetermined timing time, such that the fourth signal threshold is determined without the influences of the data background noise and the signal timing noise.

Figure 12:
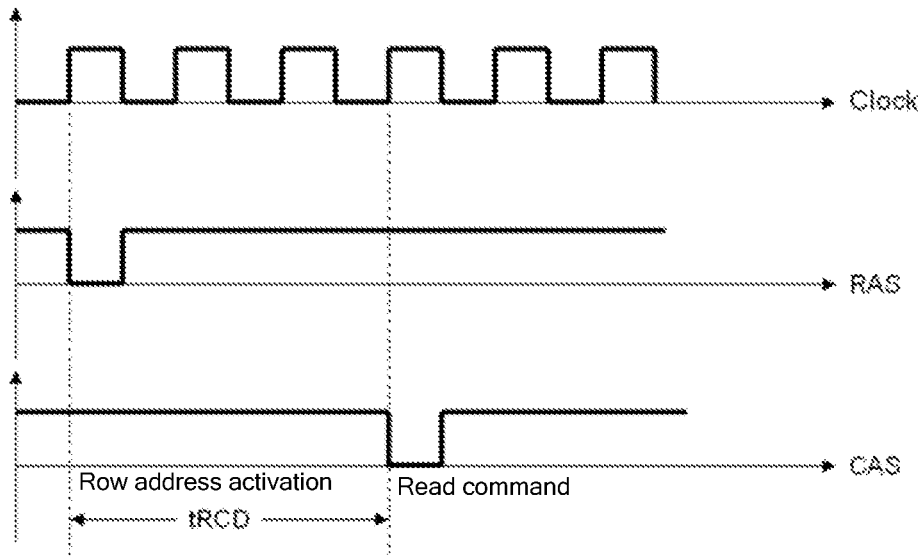
FIG. 12 schematically illustrates a waveform diagram for determining a delay time from row addressing to column addressing according to an exemplary embodiment of the present disclosure.

It should be noted that the memory includes a plurality of timings in practical situations, and there are three critical timings associated with the memory cell:

DRAM Write Recovery Time (tWR): tWR defines a time interval between the issuance of a write command (counting from the start of the write operation) and the next precharge of the memory, which is the operation preceding the precharge time of a memory line address controller. If this time is too short, the next precharge starts for addressing before the previous write operation is completed, and the data from the previous write is incomplete, causing data loss. DRAM Row Address Strobe (RAS) to Column Address Strobe (CAS) Delay (tRCD):

tRCD defines how long it takes for a memory to operate on a row address after a row address activation command is issued in a rank of the memory (a page of the memory). Each memory cell is an address where data can be stored, and each address has a corresponding row number and column number. Each row includes 1,204 column addresses. When a row address is activated, a plurality of CAS requests are sent to perform read and write operations. Simply put, if a row address is known, and a corresponding column address is found in that row, addressing is completed for read and write operations. The time between knowing the row address and finding the column address is tRCD. When a row address in memory is activated, we call it an "open page". At the same moment, 8 row addresses (8 banks, that is, one for each of the 8 granules) can be opened in one rank. FIG. 12 shows a time interval between the issuing a row address activation command and finding a column address and issuing a read command, that is, tRCD. The tRCD is the most critical addressing time, and has the greatest influence on the memory frequency. Generally, the delay needs to be extended for high frequency when adding voltage and increasing the CL value does not work. Therefore, in the exemplary embodiment of the present disclosure, the influence of tRCD on the fourth signal threshold is considered.

Figure 13:
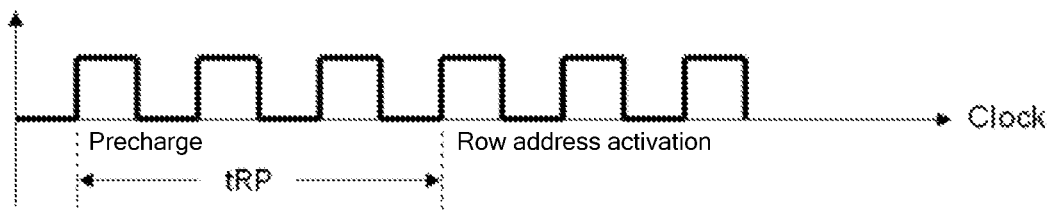
FIG. 13 schematically illustrates a waveform diagram for determining a precharge time of a memory row address controller according to an exemplary embodiment of the present disclosure.

DRAM RAS Precharge Time (tRP): After the previous row address operation is completed and after the page close command is issued, operations are to be performed on a next row address in the same bank. tRP defines the precharge time for the next row address before its activation signal is issued. Since a plurality of row addresses in the rank may be being read or written before the row address close command is issued, tRP does not have the same influence on memory performance as tRCD. The influence of tRP increases as a plurality of row address activation and close signals are operated on the bank frequently, and increasing tRP can improve stability. FIG. 13 shows the time between the start of precharging of a soon-to-be-activated row address and its activation, that is, tRP.

In practical applications, other timings than the three mentioned above may be considered for the signal timing and selected as needed. In the exemplary embodiment of the present disclosure, the influence of the signal timing noise is determined based on the corresponding lengths of tWR, tRCD and tRP in the signal timing time. To be specific, the signal timing time includes a plurality of timing sub-times, for example, including three timing sub-times corresponding to tWR, tRCD, and tRP.

Therefore, in the exemplary embodiment of the present disclosure, determining the fourth signal threshold may include: changing one timing sub-time in the signal timing time, setting each of the remaining timing sub-times to a corresponding preset sub-time, and obtaining a corresponding signal sub-threshold without influences of other timing sub-time noises. The specific preset sub-time may be set according to the actual situation. This is not particularly limited in the exemplary embodiment of the present disclosure.

For example, in an actual time setting process, the timing sub-time corresponding to tWR may be changed first, while the preset sub-times corresponding to tRCD and tRP remain unchanged. By changing the timing sub-time corresponding to tWR, the first signal sub-threshold under the influence of a timing tWR time noise can be obtained.

In practical applications, the process of obtaining the corresponding signal sub-threshold, such as the first signal sub-threshold, may specifically include: changing the voltage on the first pole plate 111 of the capacitor 110 in the memory cell 100 to obtain the FBCs of the memory under influence of different voltages. The voltage on the first pole plate 111 is changed to change a voltage difference between the first pole plate 111 and the second pole plate 112, that is, change a voltage difference between the two pole plates of the capacitor. Changing the voltage difference between the two pole plates of the capacitor simulates a voltage difference under the influence of the timing tWR time noise, and the influence of the timing tWR time noise on the memory cell is quantified, thus providing a basis for determining the first signal sub-threshold of the memory cell under the influence of the timing tWR time noise.

The specific process of changing the voltage on the first pole plate 111 of the capacitor 110 in the memory cell 100 and determining, as the first signal sub-threshold, the voltage change amount ΔV on the bit line during the read operation of the memory cell when the FBC reaches the preset allowable FBC may be performed with reference to the foregoing method and is not be described in detail herein.

Figure 14:
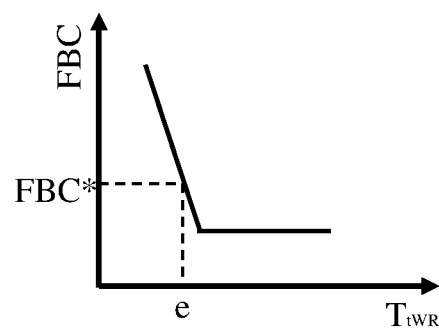
FIG. 14 to FIG. 16 each schematically illustrate a curve of an FBC varying with timing sub-times corresponding to different timing under the influence of a signal timing noise according to an exemplary embodiment of the present disclosure.

FIG. 14 shows a curve of the FBC varying with the timing sub-time $T_{tWR}$ corresponding to tWR. It can be seen from FIG. 14 that when the FBC of the memory reaches the preset allowable FBC*, the time e is the critical time corresponding to the first signal sub-threshold, and is determined as a preset sub-time corresponding to the timing sub-time $T_{tWR}$.

In the exemplary embodiment of the present disclosure, after the first signal sub-threshold is determined, the preset sub-time corresponding to tWR may be set to the time e corresponding to the first signal sub-threshold, the preset sub-time corresponding to tRP remains unchanged, and the timing sub-time corresponding to tRCD is changed, such that a second signal sub-threshold under the influences of the timing tWR time noise and the timing tRCD time noise can be obtained.

The specific process of determining the second signal sub-threshold may be performed with reference to the process of determining the first signal sub-threshold, and is not described in detail herein.

Figure 15:
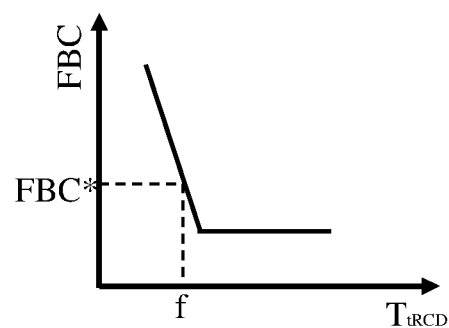

FIG. 15 shows a curve of the FBC varying with the timing sub-time $T_{tRCD}$ corresponding to tRCD. It can be seen from FIG. 15 that when the FBC of the memory reaches the preset allowable FBC*, the time f is the critical time corresponding to the second signal sub-threshold, and is determined as a preset sub-time corresponding to the timing sub-time $T_{tRCD}$.

After the second signal sub-threshold is determined, the preset sub-time corresponding to tWR may be set to the time e corresponding to the first signal sub-threshold, the preset sub-time corresponding to tRCD may be set to the time f corresponding to the second signal sub-threshold, and the timing sub-time corresponding to tRP is changed, such that a third signal sub-threshold under the combined influence of the timing tWR time noise, the timing tRCD time noise, and the timing tRP time noise can be obtained.

The specific process of determining the third signal sub-threshold may be performed with reference to the process of determining the first signal sub-threshold, and is not described in detail herein.

Figure 16:
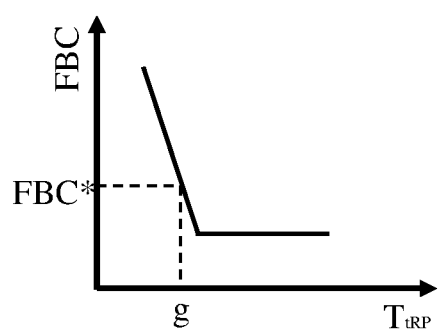

FIG. 16 shows a curve of the FBC varying with the timing sub-time $T_{tRP}$ corresponding to tRP. It can be seen from FIG. 16 that when the FBC of the memory reaches the preset allowable FBC*, the time g is the critical time corresponding to the third signal sub-threshold, and is determined as a preset sub-time corresponding to the timing sub-time $T_{tRP}$.

The process of determining the third signal sub-threshold is setting each timing sub-time to the corresponding preset sub-time, for example, setting the timing sub-time $T_{tWR}$ to e, setting the timing sub-time $T_{tRCD}$ to f, and setting the timing sub-time $T_{tRP}$ to g. In this case, it can be seen that the third signal sub-threshold is obtained under the combined influence of the timing tWR time noise, the timing tRCD time noise, and the timing tRP time noise, and thus the third signal sub-threshold is determined as a fourth signal threshold $V_{L4}$.

In an exemplary embodiment of the present disclosure, the fourth signal threshold $V_{L4}$ may be calculated according to formula (5) as follows.

$$V_{L4} = \frac{C_{Cell}}{C_{Cell} + C_{BL}} \times |V_A - V_B - (V_{24} - V_1)| \qquad (5)$$

$V_{24}$ is the second voltage corresponding to the preset allowable FBC* in the process of determining the third signal sub-threshold.

Figure 17:
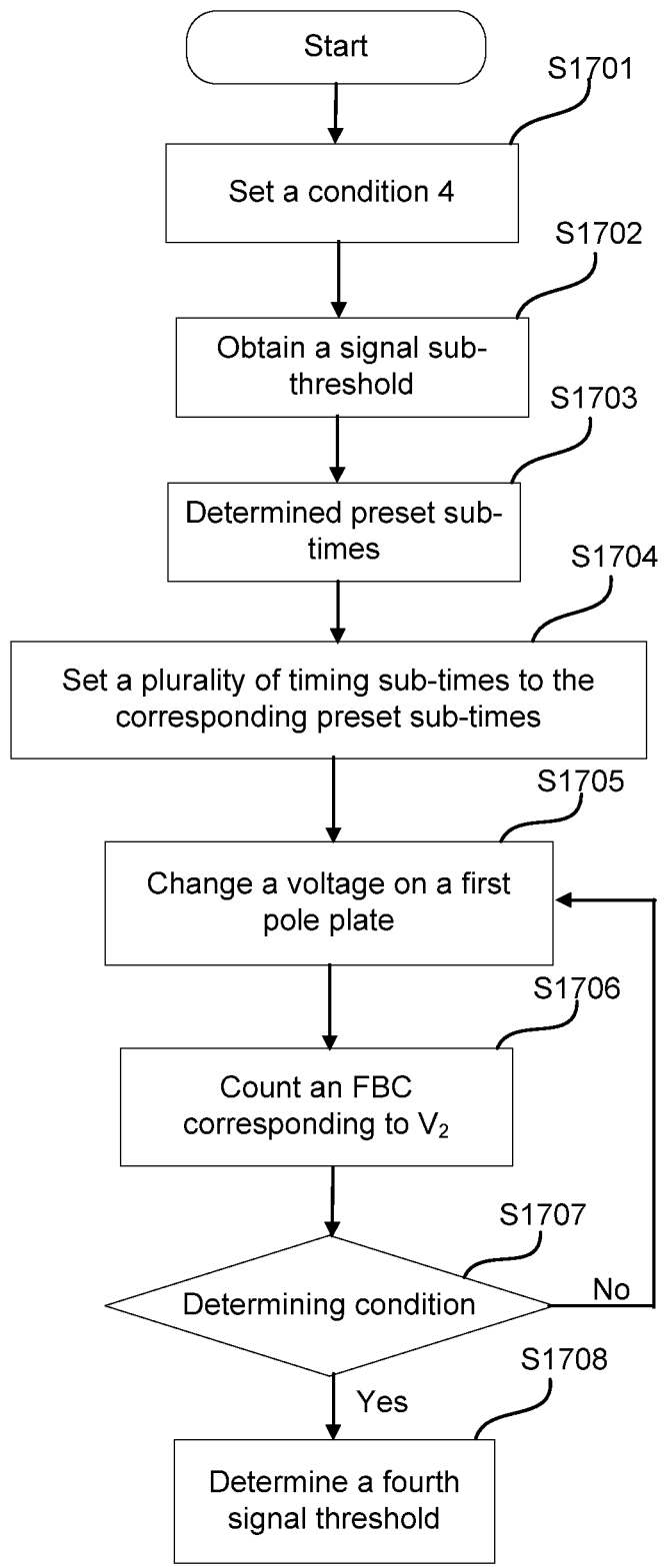
FIG. 17 schematically illustrates a flowchart for determining a fourth signal threshold under the influence of a signal timing noise according to an exemplary embodiment of the present disclosure.

FIG. 17 is a flowchart for determining the fourth signal threshold provided in an exemplary embodiment of the present disclosure. As shown in FIG. 17, in step S1701, a condition 4 is first set, where the condition 4 includes: writing same data into a plurality of memory cells of the memory, setting the data retention time to a first preset time, and setting the signal timing time to a predetermined timing time. In step S1702, one timing sub-time of the signal timing time is changed, and each of the remaining timing sub-times is set to a corresponding preset sub-time, and a corresponding signal sub-threshold is obtained, that is, a signal sub-threshold is obtained. In step S1703, a preset sub-time corresponding to each timing sub-time is determined, that is, the preset sub-time is determined. In step S1704, the plurality of timing sub-times are set to corresponding preset sub-times. In step S1705, the voltage on the first pole plate of the capacitor in the memory cell is changed, specifically including: changing the voltage on the first pole plate of the capacitor in the memory cell from the first voltage to the second voltage $V_2$ before the memory cell performs the write operation; and changing the voltage on the first pole plate back to the first voltage before the memory cell performs the read operation. In step S1706, the FBC of the memory corresponding to the second voltage $V_2$ is calculated, that is, the FBC corresponding to $V_2$ is calculated. In step S1707, a determining condition is entered, to be specific, determining whether the FBC reaches a preset allowable FBC*; and if not, proceeding to step S1705; or if yes, proceeding to step S1708, to determine the fourth signal threshold, which specifically includes: determining, as the fourth signal threshold, the voltage change amount $\Delta V$ that is on the bit line during the read operation of the memory cell and that corresponds to the second voltage $V_2$.

In step S520, the actual SM of the memory cell during data reading is determined based on the sense signal threshold.

The first signal threshold, the second signal threshold, the third signal threshold and the fourth signal threshold are in fact the sense signal threshold determined in step S510. If the actual SM under the influence of each noise is determined separately, the first signal threshold, the second signal threshold, the third signal threshold, and the fourth signal threshold are respectively the actual SM under the influence of the SA mismatch noise, the data background noise, the data retention time noise, and the signal timing noise.

However, in practice, the actual SM may be under the combined influences of the SA mismatch noise, the data background noise, the data retention time noise, and the signal timing noise. Therefore, it is more practical to determine the actual SM of the memory cell during data reading based on the first signal threshold, the second signal threshold, the third signal threshold, and the fourth signal threshold. Specifically, the actual SM may be calculated in different ways.

When the memory cell performs write and read operations, a theoretical SM $V_L$ of the memory cell needs to be calculated first.

As shown in formula (1), the theoretical SM $V_L$ is the voltage change amount $\Delta V$ generated on the bit line during the capacitor charge release process, that is, $V_L = \Delta V$. In practice, the theoretical SM $V_L$ of the memory cell may alternatively be determined based on the difference between the voltage $V_{BLP}$ on the bit line before the word line is turned on and the voltage VARY on the bit line amplified by the SA after the word line is turned on during the data read operation, that is, as shown in formula (6).

$$V_L = \frac{C_{Cell}}{C_{Cell} + C_{BL}} \times |V_A - V_B| \qquad (6)$$

Since the theoretical SM is the total SM obtained without influence of any noise on the memory cell, it includes all the SMs consumed by noises and the actual SM.

Figure 18:
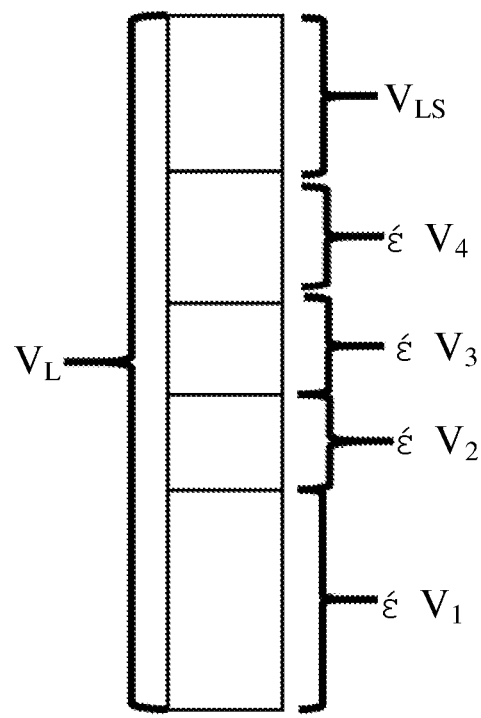
FIG. 18 schematically illustrates a schematic diagram of a relationship between a theoretical SM and an SM consumption value according to an exemplary embodiment of the present disclosure.

As shown in FIG. 18, the theoretical SM $V_L$ includes a first SM consumption value corresponding to the SA mismatch noise $\Delta V_1$, a second SM consumption value corresponding to the data background noise $\Delta V_2$, a third SM consumption value $\Delta V_3$ corresponding to the data retention time noise, a fourth SM consumption value $\Delta V_4$ corresponding to the signal timing noise, and the actual SM $V_{LS}$.

In an exemplary embodiment of the present disclosure, the first SM consumption value $\Delta V_1$ corresponding to the SA mismatch noise may be determined based on the theoretical SM $V_L$ and the first signal threshold $V_{L1}$. Specifically, the first SM consumption value $\Delta V_1$ may be determined based on the difference between the theoretical SM $V_L$ and the first signal threshold $V_{L1}$, as shown in formula (7).

$$\Delta V_1 = V_L - V_{L1} = \frac{C_{Cell}}{C_{Cell} + C_{BL}} \times |V_{21} - V_1| \qquad (7)$$

In an exemplary embodiment of the present disclosure, since the second signal threshold includes the influences of the data background noise and the SA mismatch noise, the second SM consumption value $\Delta V_2$ corresponding to the data background noise may be determined based on the first signal threshold $V_{L1}$ and the second signal threshold $V_{L2}$. Specifically, the second SM consumption value $\Delta V_2$ may be determined based on the difference between the first signal threshold $V_{L1}$ and the second signal threshold $V_{L2}$, as shown in formula (8).

$$\Delta V_2 = V_{L1} - V_{L2} = \frac{C_{Cell}}{C_{Cell} + C_{BL}} \times |V_{22} - V_1| \tag{8}$$

In an exemplary embodiment of the present disclosure, since the third signal threshold includes the influences of the data retention time noise and the SA mismatch noise, the third SM consumption value $\Delta V_3$ corresponding to the data retention time noise may be determined based on the first signal threshold $V_{L1}$ and the third signal threshold $V_{L3}$. Specifically, the third SM consumption value $\Delta V_3$ may be determined based on the difference between the first signal threshold $V_{L1}$ and the third signal threshold $V_{L3}$, as shown in formula (9).

$$\Delta V_3 = V_{L1} - V_{L3} = \frac{C_{Cell}}{C_{Cell} + C_{BL}} \times |V_{23} - V_1| \tag{9}$$

In the exemplary embodiment of the present disclosure, since the fourth signal threshold includes the influences of the signal timing noise and the SA mismatch noise, the fourth SM consumption value $\Delta V_4$ corresponding to the signal timing noise may be determined based on the first signal threshold $V_{L1}$ and the fourth signal threshold $V_{L4}$. Specifically, the second SM consumption value $\Delta V_4$ may be determined based on the difference between the first signal threshold $V_{L1}$ and the fourth signal threshold $V_{L4}$, as shown in formula (10).

$$\Delta V_4 = V_{L1} - V_{L4} = \frac{C_{Cell}}{C_{Cell} + C_{BL}} \times |V_{24} - V_1| \tag{10}$$

After determining the SM consumption values, the actual SM $V_{LS}$ may be determined based on the theoretical SM $V_L$, the first SM consumption value $\Delta V_1$, the second SM consumption value $\Delta V_2$, the third SM consumption value $\Delta V_3$, and the fourth SM consumption value $\Delta V_4$, as shown in formula (11).

$$V_{LS} = V_L - \Delta V_1 - \Delta V_2 - \Delta V_3 - \Delta V_4 = \frac{C_{Cell}}{C_{Cell} + C_{BL}} \times \tag{11}$$
$$(|V_A - V_B| - |V_{21} - V_1| - |V_{22} - V_1| - |V_{23} - V_1| - |V_{24} - V_1|)$$

It should be noted that in the process of determining the actual SM, the theoretical SM may not be calculated, and the actual SM $V_{LS}$ is determined based on the first signal threshold $V_{L1}$, the second SM consumption value $\Delta V_2$, the third SM consumption value $\Delta V_3$, and the fourth SM consumption value $\Delta V_4$, as shown in formula (12).

$$V_{LS} = V_{L1} - \Delta V_2 - \Delta V_3 - \Delta V_4 = \frac{C_{Cell}}{C_{Cell} + C_{BL}} \times \tag{12}$$
$$(|V_A - V_B| - |V_{21} - V_1| - |V_{22} - V_1| - |V_{23} - V_1| - |V_{24} - V_1|)$$

Similarly, the actual SM $V_{LS}$ may be determined based on the second signal threshold $V_{L2}$, the first SM consumption value $\Delta V_1$, the third SM consumption value $\Delta V_3$, and the fourth SM consumption value $\Delta V_4$, as shown in formula (13).

$$V_{LS} = V_{L2} - \Delta V_2 - \Delta V_3 - \Delta V_4 = \frac{C_{Cell}}{C_{Cell} + C_{BL}} \times \tag{13}$$
$$(|V_A - V_B| - |V_{21} - V_1| - |V_{22} - V_1| - |V_{23} - V_1| - |V_{24} - V_1|)$$

By analogy, the actual SM may alternatively be determined based on other signal thresholds and the remaining SM consumption values. Details are not described herein.

After the actual SM is determined, the memory performance may be determined with reference to the preset SM. For example, if the SA mismatch noise, the data background noise, the data retention time noise, and the signal timing noise consume the SM of the memory cell, and the remaining actual SM is not sufficient for reading data correctly, that is, the consumption value exceeds the preset SM, it is considered that the memory fails. The preset SM may be set according to the actual needs. This is not particularly limited in the exemplary embodiment of the present disclosure.

Alternatively, the influence of each corresponding noise on the performance of the memory cell may be determined based on the proportion of the first signal threshold $V_{L1}$, the second SM consumption value $\Delta V_2$, the third SM consumption value $\Delta V_3$, and the fourth SM consumption value $\Delta V_4$ to the theoretical SM $V_L$, thus providing a theoretical basis for the improvement of the memory cell. For example, if the proportion of the first signal threshold $V_{L1}$ is the largest, it indicates that the SA mismatch noise has the greatest influence on the storage performance of the memory cell, and the storage performance of the memory cell may be improved by reducing the SA mismatch noise. In the exemplary embodiment of the present disclosure, in the process of determining the second signal threshold, the most influential data distribution structure corresponding to the data background noise can be determined. The most influential data distribution structure refers to a data distribution structure of the memory cells corresponding to the minimum voltage $V_{22}$. In the process of determining the third signal threshold, the most influential data retention time corresponding to the data retention time noise can be determined. The most influential data retention time refers to a data retention time of the memory cell corresponding to the minimum voltage $V_{23}$.

In the process of determining the fourth signal threshold, the most influential signal timing time corresponding to the signal timing noise can be determined. The most influential signal timing time refers to a critical time corresponding to the plurality of signal sub-thresholds.

Finally, the actual SM may be determined based on the most influential data distribution structure, the most influential data retention time and the most influential signal timing time. Specifically, data corresponding to the most influential data distribution structure may be written into the plurality of memory cells, the data retention time may be set to the most influential data retention time, the signal timing time may be set to the most influential signal timing time, and the actual SM may be obtained by using the foregoing method for obtaining the first signal threshold. The specific process is not described in detail herein.

It should be noted that, in the process of determining the actual SM, the data distribution structure, the data retention time and the signal timing time may be flexibly changed according to the actual needs, to obtain the actual SM under the influence of one noise, two noises, three noises, four noises, or even more noises. In this way, the influence of coupling a plurality of noises on the SM may be studied to provide a practical reference for the performance improvement of the memory cell.

In addition, the sense signal thresholds of the memory cell under the influence of different noises are obtained, and the corresponding SM consumption values are determined based on the sense signal thresholds. Based on the actual SM and the proportion of each SM consumption value to the theoretical SM, the performance of the memory cell and the most influential noise may be determined, thus providing support for the maintenance and improvement of the memory cell.

It should be noted that although the steps of the method in the present disclosure are described in the accompanying drawings in a particular sequence, it is not required or implied that the steps must be performed in that particular sequence or that all of the steps shown must be performed to achieve the desired results. Additionally or alternatively, some steps may be omitted, a plurality of steps may be combined into a single step for execution, and/or a single step may be divided into a plurality of steps for execution.

Figure 19:
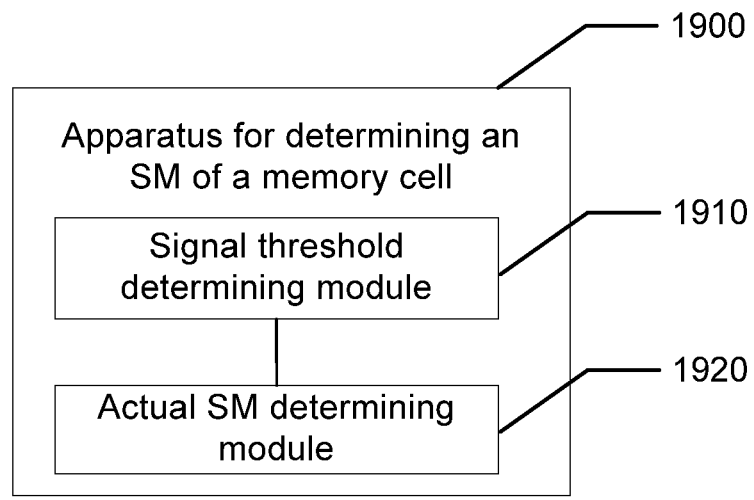
FIG. 19 schematically illustrates a block diagram of an apparatus for determining an SM of a memory cell according to an exemplary embodiment of the present disclosure.

In addition, in an example embodiment, an apparatus for determining an SM of a memory cell is provided. Referring to FIG. 19, the apparatus 1900 for determining an SM of a memory cell may include: a signal threshold determining module 1910 and an actual SM determining module 1920.

The signal threshold determining module 1910 may be configured to: when the memory cell performs write and read operations, determine a sense signal threshold of the memory cell under the influence of a noise; and the actual SM determining module 1920 may be configured to determine, based on the sense signal threshold, an actual SM of the memory cell during data reading.

The details of the virtual modules of the apparatus for determining an SM of a memory cell have been described in the corresponding method for determining an SM of a memory cell, and are described in detail herein.

It should be noted that although several modules or units of the apparatus for determining an SM of a memory cell are mentioned in detail above, this division is not mandatory. In fact, according to the embodiments of the present disclosure, the features and functions of two or more modules or units described above may be embodied in one module or unit. Conversely, the features and functions of one module or unit described above may be further divided into multiple modules or units.

An exemplary embodiment of the present disclosure further provides an electronic device that can be used to implement the foregoing method.

Those skilled in the art can understand that aspects of the present disclosure may be implemented as systems, methods, or program products. The aspects of the present disclosure may be specifically implemented in the form of a fully hardware implementation, a fully software implementation (including firmware, microcode, or the like), or a combination of hardware and software, which may be collectively referred to as a "circuit", "module", or "system".

An electronic device 2000 according to this embodiment of the present disclosure is described below with reference to FIG. 20. The electronic device 2000 shown in FIG. 20 is merely an example, and should not cause any limitation to the functions and application range of the embodiments of the present disclosure.

Figure 20:
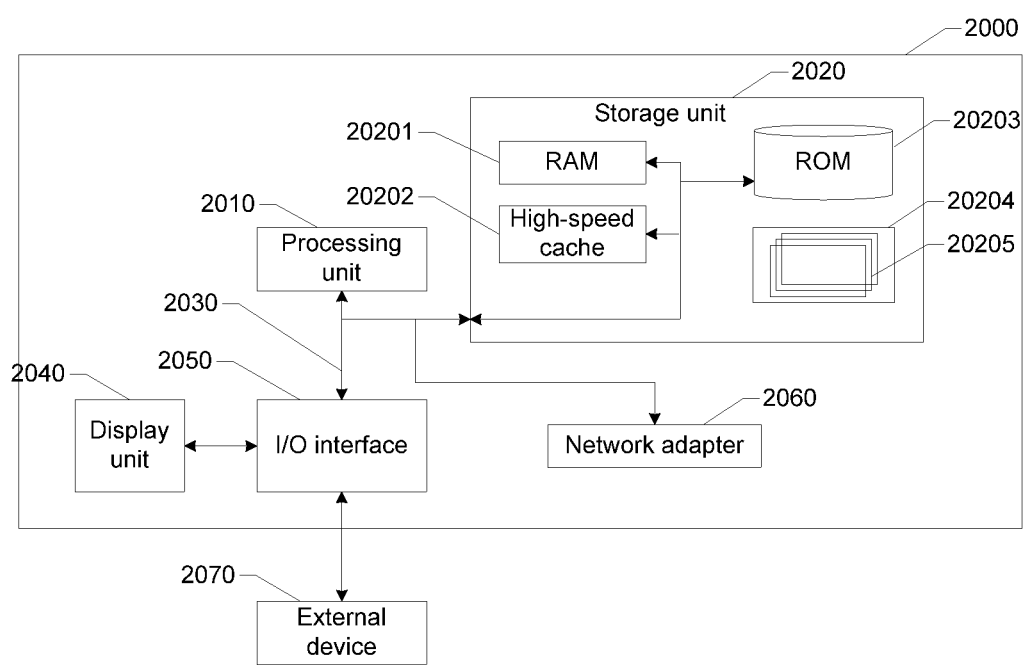
FIG. 20 schematically illustrates a schematic module diagram of an electronic device according to an exemplary embodiment of the present disclosure.

As shown in FIG. 20, the electronic device 2000 is represented in the form of a general purpose computer. The components of the electronic device 2000 may include, but are not limited to, at least one processing unit 2010, at least one storage unit 2020, a bus 2030 connecting different system components (including the memory cell 2020 and the processing unit 2010), and a display unit 2040.

The storage unit 2020 stores program code which can be executed by the processing unit 2010, such that the processing unit 2010 performs the steps according to the exemplary embodiments of the present disclosure described in the "exemplary methods" of this specification. For example, the processing unit 2010 may perform step S510 in FIG. 5: when the memory cell performs write and read operations, determining a sense signal threshold of a memory cell under the influence of a noise; and step S520: determining, based on the sense signal threshold, an actual SM of the memory cell during data reading.

The memory cell 2020 may include a readable medium in the form of a volatile memory cell, for example, a random access memory cell (RAM) 20201 and/or a cache memory cell 20202, and may further include a read-only memory cell (ROM) 20203.

The memory cell 2020 may alternatively include a program/utility 20204 including a set of (at least one) program modules 20205, and the program module 20205 includes, but is not limited to: an operating system, one or more applications, other program modules and program data. Each of these examples or some combination thereof may include an implementation of a network environment.

The bus 2030 may be one or more of several types of bus structures, including a memory cell bus or a memory cell controller, a peripheral bus, a graphics acceleration port, a processing unit, or a local area bus using any of a plurality of bus structures.

The electronic device 2000 may further communicate with one or more external devices 2070 (for example, a keyboard, a pointing device, or a Bluetooth device), with one or more devices that enable the user to interact with the electronic device 2000, and/or with any device that enables the electronic device 2000 to communicate with one or more other computing devices (for example, a router or a modem). Such communication may be performed through an input/output (I/O) interface 2050. The electronic device 2000 may further communicate with one or more networks (for example, a local area network (LAN), a wide area network (WAN), and/or a public network such as the Internet) through a network adapter 2060. As shown in the figure, the network adapter 2060 communicates with other modules of the electronic device 2000 via the bus 2030. It should be understood that although not shown in the figure, other hardware and/or software modules may be used in combination with the electronic device 2000, including but not limited to: microcode, a device driver, a redundant processing unit, an external disk drive arrays, an RAID system, a tape driver, and a data backup storage system.

Through the foregoing description of the embodiments, persons skilled in the art may easily understand that the exemplary embodiments described herein may be implemented by software, or may be implemented by software in combination with necessary hardware. Therefore, the technical solutions according to the embodiments of the present disclosure may be implemented in a form of a software product. The software product may be stored in a non-volatile storage medium (which may be a CD-ROM, a USB flash drive, a removable hard disk, or the like), and includes a plurality of instructions to cause a computing device (which may be a personal computer, a server, a terminal apparatus, a network device, or the like) to perform the method according to the embodiments of the present disclosure.

An exemplary embodiment of the present disclosure further provides a computer readable storage medium, where the computer readable storage medium stores a program product that can be used to implement the method in the specification. In some possible embodiments, various aspects of the present disclosure may also be realized in the form of a program product, which includes program code. When the program product runs on a terminal device, the program code is used to enable the terminal device to perform the steps according to various exemplary embodiments of the present disclosure described in the foregoing "exemplary methods" of this specification.

A program product for implementing the method according to the embodiments of the present disclosure may be in the form of a portable compact disk read-only memory (CD-ROM) and include program code, and may be run on a terminal device, such as a personal computer. However, the program product of the present disclosure is not limited hereto. In the present disclosure, the computer-readable storage medium may be any tangible medium that contains or stores a program, and the program may be used by or in combination with an instruction execution system, apparatus, or device.

The program product may be any combination of one or more readable media. The readable medium may be a readable signal medium or a readable storage medium. The readable storage medium, may be, for example, but not limited to, electrical, magnetic, optical, electromagnetic, infrared, or semiconductor systems, apparatuses, or devices, or any combination thereof. More specific examples of the readable storage medium may include, but are not limited to: an electrical connection with one or more conducting wires, a portable computer disk, a hard disk, a RAM, a ROM, an erasable programmable ROM (an EPROM or a flash memory), an optical fiber, a CD-ROM, an optical storage device, a magnetic storage device, or any suitable combination thereof.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

The computer-readable signal medium may include a data signal propagated in a baseband or as a part of a carrier, and readable program code is carried therein. The propagated data signal may be in various forms, including but not limited to an electromagnetic signal, an optical signal, or any suitable combination thereof. The readable signal medium may alternatively be any readable medium other than the readable storage medium. The readable medium may send, propagate, or transmit a program configured to be used by or in combination with an instruction execution system, apparatus, or device.

The program code contained on the readable medium may be transmitted using any suitable medium, including but not limited to: wireless, wire, optical fiber, RF, or any suitable combination thereof.

Computer program code for executing the operations in the present disclosure may be compiled by using one or more programming languages or a combination thereof.

The programming languages include object oriented programming languages, such as Java and C++, and conventional procedural programming languages, such as C or similar programming languages. The program code can be executed fully on a user computer, executed partially on a user device, executed as an independent software package, executed partially on a user computer and partially on a remote computer, or executed fully on a remote computer or a server. In a circumstance in which a remote computer is involved, the remote computer may be connected to a user computer via any type of network, including a local area network (LAN) or a wide area network (WAN), or may be connected to an external computer (for example, connected via the Internet by using an Internet service provider).

In addition, the foregoing accompanying drawings are merely schematic illustrations of the processing included in the method according to the exemplary embodiments of the present invention, and are not intended for limitation. It is easily understood that the processes shown in the foregoing accompanying drawings does not indicate or limit a chronological sequence of these processes. In addition, it is also easily understood that these processes can be performed synchronously or asynchronously, for example, in a plurality of modules.

Those skilled in the art can readily figure out other embodiments of the present disclosure after considering the specification and practicing the content disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A method for determining a signal margin of a memory cell, wherein the method comprises:
   when the memory cell performs write and read operations, determining a sense signal threshold of the memory cell under an influence of a noise; and
   determining, based on the sense signal threshold, an actual signal margin of the memory cell during data reading; wherein:
   the noise comprises a sense amplifier mismatch noise; and
   the determining a sense signal threshold of the memory cell under an influence of a noise comprises:
      determining a first signal threshold of the memory cell under an influence of the sense amplifier mismatch noise, comprising:
         writing same data into a plurality of memory cells of a memory, setting a data retention time to a first preset time, setting a signal timing time to a second preset time, and determining the first signal threshold.

2. The method for determining a signal margin of a memory cell according to claim 1, wherein the noise further comprises at least one of a data background noise, a data retention time noise, or a signal timing noise.

3. The method for determining a signal margin of a memory cell according to claim 2, wherein the determining a sense signal threshold of the memory cell under an influence of a noise further comprises at least one of:
   determining a second signal threshold of the memory cell under an influence of the data background noise;
   determining a third signal threshold of the memory cell under an influence of the data retention time noise; or
   determining a fourth signal threshold of the memory cell under an influence of the signal timing noise.

4. The method for determining a signal margin of a memory cell according to claim 3, wherein the determining, based on the sense signal threshold, an actual signal margin of the memory cell during data reading comprises:
   determining the actual signal margin of the memory cell during data reading based on at least one of the first signal threshold, the second signal threshold, the third signal threshold or the fourth signal threshold.

5. The method for determining a signal margin of a memory cell according to claim 4, wherein the determining the actual signal margin of the memory cell during data reading based on at least one of the first signal threshold, the second signal threshold, the third signal threshold or the fourth signal threshold comprises:
   calculating a theoretical signal margin of the memory cell;
   calculating a first signal margin consumption value corresponding to the sense amplifier mismatch noise based on the theoretical signal margin and the first signal threshold;
   calculating a second signal margin consumption value corresponding to the data background noise based on the first signal threshold and the second signal threshold;
   calculating a third signal margin consumption value corresponding to the data retention time noise based on the first signal threshold and the third signal threshold;
   calculating a fourth signal margin consumption value corresponding to the signal timing noise based on the first signal threshold and the fourth signal threshold; and
   determining the actual signal margin based on the theoretical signal margin, the first signal margin consumption value, the second signal margin consumption value, the third signal margin consumption value, and the fourth signal margin consumption value.

6. The method for determining a signal margin of a memory cell according to claim 4, wherein the determining the actual signal margin of the memory cell during data reading based on at least one of the first signal threshold, the second signal threshold, the third signal threshold or the fourth signal threshold comprises:
   calculating a second signal margin consumption value corresponding to the data background noise based on the first signal threshold and the second signal threshold;
   calculating a third signal margin consumption value corresponding to the data retention time noise based on the first signal threshold and the third signal threshold;
   calculating a fourth signal margin consumption value corresponding to the signal timing noise based on the first signal threshold and the fourth signal threshold; and
   determining the actual signal margin based on the first signal threshold, the second signal margin consumption value, the third signal margin consumption value, and the fourth signal margin consumption value.

7. The method for determining a signal margin of a memory cell according to claim 1, wherein the determining the first signal threshold comprises:
   changing a voltage on a first pole plate of a capacitor in the memory cell to obtain a failed bit count of the memory under an influence of different voltages, wherein a second pole plate of the capacitor is connected to a source of a transistor in the memory cell, and the first pole plate is disposed opposite to the second pole plate; and
   when the failed bit count reaches a preset allowable failed bit count, determining a voltage change amount on a bit line of the memory cell during the read operation as the first signal threshold.

8. The method for determining a signal margin of a memory cell according to claim 3, wherein the determining a second signal threshold of the memory cell under an influence of the data background noise comprises:
   writing different data into the plurality of memory cells of the memory based on different data distribution structures, setting the data retention time to the first preset time, setting the signal timing time to the second preset time, and determining the second signal threshold.

9. The method for determining a signal margin of a memory cell according to claim 8, wherein the determining the second signal threshold comprises:
   changing a voltage on a first pole plate of a capacitor in the memory cell to obtain a failed bit count of the memory under an influence of different voltages;
   changing the data distribution structure to obtain the different voltages on the first pole plate corresponding to the different data distribution structures when the failed bit count reaches a preset allowable failed bit count; and
   determining a minimum voltage in the different voltages, and determining a voltage change amount that is on a bit line during the read operation of the memory cell corresponding to the minimum voltage as the second signal threshold.

10. The method for determining a signal margin of a memory cell according to claim 3, wherein the determining a third signal threshold of the memory cell under an influence of the data retention time noise comprises:

writing the same data into the plurality of memory cells of the memory, setting the signal timing time to the second preset time, setting the data retention time to a predetermined retention time, and determining the third signal threshold; and wherein the determining a fourth signal threshold of the memory cell under an influence of the signal timing noise comprises:

writing the same data into the plurality of memory cells of the memory, setting the data retention time to the first preset time, setting the signal timing time to a predetermined timing time, and determining the fourth signal threshold.

11. The method for determining a signal margin of a memory cell according to claim 10, wherein the determining the third signal threshold comprises:

changing a voltage on a first pole plate of a capacitor in the memory cell to obtain a failed bit count of the memory under an influence of different voltages;

changing the predetermined retention time to obtain the different voltages on the first pole plate corresponding to different predetermined retention times when the failed bit count reaches a preset allowable failed bit count; and determining a minimum voltage in the different voltages, and determining a voltage change amount that is on a bit line during the read operation of the memory cell corresponding to the minimum voltage as the third signal threshold; and wherein the signal timing time comprises a plurality of timing sub-times; and the determining the fourth signal threshold comprises:

changing one timing sub-time in the signal timing time, setting each of the remaining timing sub-times to a corresponding preset sub-time, and obtaining a corresponding signal sub-threshold;

determining a critical time corresponding to the signal sub-threshold as a preset sub-time corresponding to the timing sub-time; and setting each of the plurality of timing sub-times to a corresponding preset sub-time, and obtaining the fourth signal threshold.

12. The method for determining a signal margin of a memory cell according to claim 11, wherein the obtaining a corresponding signal sub-threshold comprises:

changing the voltage on the first pole plate of the capacitor in the memory cell to obtain the failed bit count of the memory under the influence of the different voltages, wherein a second pole plate of the capacitor is connected to a source of a transistor in the memory cell, and the first pole plate is disposed opposite to the second pole plate; and when the failed bit count reaches the preset allowable failed bit count, determining the voltage change amount on the bit line of the memory cell during the read operation as the signal sub-threshold.

13. The method for determining a signal margin of a memory cell according to claim 7, wherein the changing a voltage on a first pole plate of a capacitor in the memory cell comprises:

changing the voltage on the first pole plate of the capacitor in the memory cell from a first voltage to a second voltage before the memory cell performs the write operation; and changing the voltage on the first pole plate back to the first voltage before the memory cell performs the read operation.

14. The method for determining a signal margin of a memory cell according to claim 13, wherein obtaining the failed bit count of the memory under the influence of the different voltages comprises:

changing the second voltage to obtain the failed bit count under an influence of different second voltages.

15. The method for determining a signal margin of a memory cell according to claim 3, wherein the method further comprises:

determining, in a process of determining the second signal threshold, a most influential data distribution structure corresponding to the data background noise;

determining, in a process of determining the third signal threshold, a most influential data retention time corresponding to the data retention time noise;

determining, in a process of determining the fourth signal threshold, a most influential signal timing time corresponding to the signal timing noise; and determining the actual signal margin based on the most influential data distribution structure, the most influential data retention time, and the most influential signal timing time.

16. The method for determining a signal margin of a memory cell according to claim 15, wherein the determining the actual signal margin based on the most influential data distribution structure, the most influential data retention time, and the most influential signal timing time comprises:

writing data corresponding to the most influential data distribution structure into the plurality of memory cells of the memory, setting the data retention time to the most influential data retention time, setting the signal timing time to the most influential signal timing time, and calculating the actual signal margin.

17. The method for determining a signal margin of a memory cell according to claim 1, wherein the method further comprises:

determining, based on the actual signal margin and a preset signal margin, whether the memory cell is at a risk of data reading errors.

18. An apparatus for determining a signal margin of a memory cell, wherein the apparatus comprises:

a processor; and a memory, configured to store instructions executable by the processor, wherein:

the processor is configured to execute the instructions to perform a method for determining the signal margin of the memory cell, and the method comprises:

when the memory cell performs write and read operations, determining a sense signal threshold of the memory cell under an influence of a noise; and determining, based on the sense signal threshold, an actual signal margin of the memory cell during data reading; wherein:

the noise comprises a sense amplifier mismatch noise; and the determining a sense signal threshold of the memory cell under an influence of a noise comprises:

determining a first signal threshold of the memory cell under an influence of the sense amplifier mismatch noise, comprising:

writing same data into a plurality of memory cells of a second memory, setting a data retention time to a first preset time, setting a signal timing time to a second preset time, and determining the first signal threshold.

19. A non-transitory computer-readable storage medium, wherein the non-transitory computer-readable storage medium stores a computer program, the computer program is executed by a processor to implement a method for determining a signal margin of a memory cell, and the method comprises:
- when the memory cell performs write and read operations, determining a sense signal threshold of the memory cell under an influence of a noise; and
- determining, based on the sense signal threshold, an actual signal margin of the memory cell during data reading; wherein:
 - the noise comprises a sense amplifier mismatch noise; and
 - the determining a sense signal threshold of the memory cell under an influence of a noise comprises:
   - determining a first signal threshold of the memory cell under an influence of the sense amplifier mismatch noise, comprising:
   - writing same data into a plurality of memory cells of a memory, setting a data retention time to a first preset time, setting a signal timing time to a second preset time, and determining the first signal threshold.

\* \* \* \* \*